US007162401B1

(12) United States Patent
Abeles

(10) Patent No.: US 7,162,401 B1
(45) Date of Patent: Jan. 9, 2007

(54) MONITORING OF RESOURCES THAT ARE BEING MODELED BY SIMULATION OR EMULATION

(75) Inventor: Robert Emil Abeles, San Francisco, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 505 days.

(21) Appl. No.: 10/402,817

(22) Filed: Mar. 28, 2003

(51) Int. Cl.
G06F 17/50 (2006.01)
G06G 7/62 (2006.01)

(52) U.S. Cl. .............................. 703/13; 703/14; 703/6
(58) Field of Classification Search .................. 703/23, 703/6, 13, 14; 707/206
See application file for complete search history.

(56) References Cited

U.S. PATENT DOCUMENTS

| 5,544,067 | A |   | 8/1996  | Rostoker et al. ............ 364/489 |
|-----------|---|---|---------|-------------------------------------|
| 5,560,003 | A | * | 9/1996  | Nilsen et al. ............... 707/206 |
| 5,920,490 | A |   | 7/1999  | Peters ........................ 364/578 |
| 6,470,478 | B1| * | 10/2002 | Bargh et al. .................... 716/4 |
| 6,654,773 | B1| * | 11/2003 | Hills ........................... 707/206 |
| 6,681,241 | B1| * | 1/2004  | Fagen et al. ................. 718/104 |
| 2001/0000821 | A1 | * | 5/2001  | Kolodner et al. ........... 711/170 |
| 2003/0125915 | A1 | * | 7/2003  | Gabele et al. ................ 703/13 |
| 2003/0135354 | A1 | * | 7/2003  | Gabele et al. ................ 703/13 |

OTHER PUBLICATIONS

Steve D. Pate, "Unix Filesystems Evolution, Design and Implementation", 2003, VERITAS, ISBN 0-471-16483-6, pp. i-xvi, 133-154.*
Brian Goetz, "Java theory and practice: Garbage collection and performance", http://www-128.ibm.com/developerworks/java/library/j-jtp01274.html, 2004.*

Choi et al, "Design, Implementation, and Performance Evaluation of a Detection-Based Adaptive Block Replacement Scheme", IEEE, Jul. 2002.*
IECC.com, "GC FAQ—draft", http://www.iecc.com/gclist/GC-faq.html, 1999.*
Ken Gottry, "Pick up performance with generational garbage collection", web.archive.org/web/20020126213559/www.javaworld.com/javaworld/jw-01-2002/jw-0111-hotspotgc_p.html, 2002.*
Chapter 3 entitled "The Buffer Cache" in a book entitled "The Design of the Unix Operating System", Maurice J. Bach, Prentice-Hall, Inc, 1986, ISBN 0-13-201799-7 025, pp. 38-58.

* cited by examiner

*Primary Examiner*—Hugh Jones
*Assistant Examiner*—David Silver
(74) *Attorney, Agent, or Firm*—Silicon Valley Patent Group LLP; Omkar Suryadevara

(57) ABSTRACT

Whenever a resource being modeled is accessed, an indication about the access is stored in a number of memory locations of a corresponding number of applications that are interested in monitoring the resource. The memory locations (also called "monitoring memory locations") are individually identified for each application when allocating a location in main memory. At this time, a pointer to the monitoring memory location is supplied to the application and also added to a group of pointers of locations to be updated when accessing the resource. In addition, in certain embodiments, a bit is allocated within a bitmap for each monitoring memory location for any given application. Such a bit is set at the time of updating the corresponding monitoring memory location and cleared when the application reads the monitoring memory location. Just checking the bitmap as a whole can inform an application if there is any change in any monitoring memory locations of that application. Moreover, the application may use individual bits of the bitmap to identify (and cycle through) only those monitoring memory locations that have changed. Update of monitoring memory locations may be implemented via overloading of operators that access each resource.

11 Claims, 9 Drawing Sheets

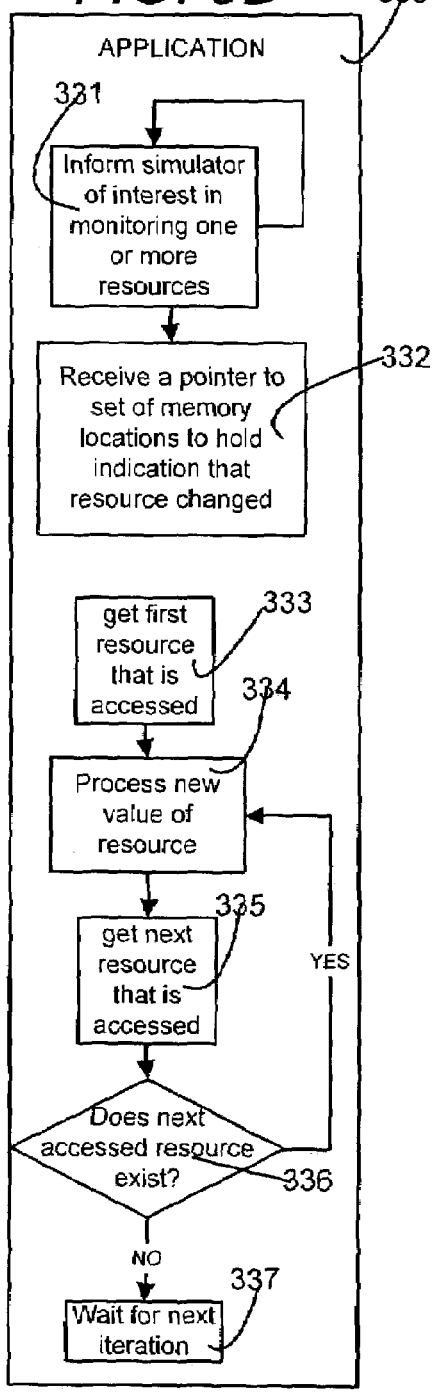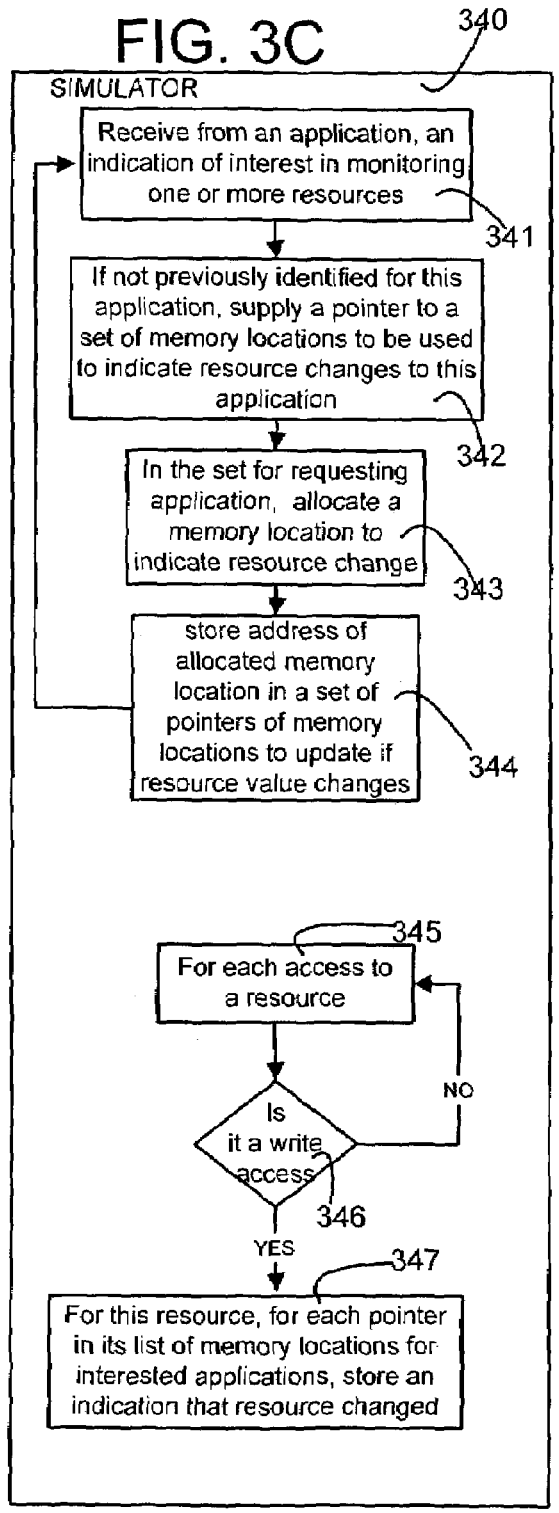

MONITORING OF RESOURCES THAT ARE BEING MODELED BY SIMULATION OR EMULATION

CROSS-REFERENCE TO COMPUTER PROGRAM LISTING APPENDIX

Appendix A contains the following files in one CD-ROM (of which two identical copies are attached hereto), and is a part of the present disclosure and is incorporated by reference herein in its entirety.

Volume in drive D is 030326_1734
  Volume Serial Number is B8A7-8C20
  Directory of D:\

| | | |
|---|---|---|
| 03/13/2003 12:21p | 40,627 | CHPSETCC.TXT |
| 03/13/2003 12:21p | 10,268 | CHPSTHH.TXT |
| 03/13/2003 12:21p | 8,694 | ELETYPCC.TXT |
| 03/13/2003 12:21p | 29,400 | ELETYPHH.TXT |
| 03/13/2003 12:21p | 63,325 | RESRCCC.TXT |
| 03/13/2003 12:21p | 26,199 | RESRCHH.TXT |
| 03/13/2003 12:21p | 4,601 | UTILSCC.TXT |
| 03/13/2003 12:21p | 16,961 | UTILSHH.TXT |
| 8 File(s) | 200,075 bytes | |
| 0 Dir(s) | 0 bytes free | |

The files of Appendix A form source code of computer programs for an illustrative embodiment of the present invention.

The files RESRCHH.TXT and RESRCCC.TXT contain computer instructions in the C++ language, for use with an ANSI compliant C++ compiler, such as a GCC compiler, version 2.95.3 available on the Internet. These two files describe a resource database including a number of resources that can be queried by an application (e.g. a graphical user interface may query: show task 35's general register 3) in one embodiment of a computer that supports a simulator of the type described below. The files UTILSC-C.TXT and UTILSHH.TXT contain utilities for use with the simulator. The files ELETYPCC.TXT and ELETYPHH.TXT contain software to create registers and memories in the simulator. The files CHPSETCC.TXT and CHPSTHH.TXT contain software to implement certain portions of the simulator.

The software generated by compiling the above-described files can be executed in a Sun workstation running the operating system Solaris, version 2.8.

Note that instead of using C++ software, other embodiments may use software written in other languages such as Smalltalk or Java.

BACKGROUND OF THE INVENTION

U.S. Pat. No. 6,470,478 granted to Bargh, et al. describes a counting instrument designed to detect occurrences of a count event within a design entity during simulation of the digital circuit design. The counting instrument is utilized to monitor each instantiation of the design entity within the simulation model without the instrumentation entity becoming incorporated into the digital circuit design.

Specifically, as illustrated in FIG. 1 attached hereto, Bargh, et al. describe an instance 10 and an instance 11 of an instrumentation entity FXUCHK that are depicted to be performing monitoring on two instances 21a and 21b of an FXU entity. For each instantiation of FXU entity 21a and 21b, an instantiation 10 and 11 respectively, of FXUCHK is automatically generated. In a similar fashion, instrumentation entity FPUCHK 12, is instantiated to monitor FPU entity 22. Bargh et al. state that the automatic instantiation of instrumentation entities for each instance of a target entity is a significant advantage.

Bargh et al. further state that each instrumentation entity can monitor any signal within its associated target entity. In the example of FIG. 1, entity FXUCHK is depicted as monitoring a signal Q 72, a signal R 76, and a signal S 74 within each of instances 21a and 21b of the FXU entity. Signal Q 72, is a signal within the instances 25a and 25b of descendant entity A. Likewise, signal S 74 is a signal within descendant entity C which is within descendant entity B. Finally, signal R 76 occurs directly within FXU entity 21. An instrumentation entity may monitor any signal within a target entity or the target entity's descendent entities. However, signals outside the target entity cannot be monitored.

According to Bargh, et al., each instrumentation entity is connected by means of fail, count, and harvest signals to an instrumentation logic block 20. Instrumentation logic block 20 is generated automatically and contains logic for recording occurrences of each of the three event types. For the count events monitored in simulation model 29, a set of counters 21 are utilized to count the number of occurrences of each count event. In a similar manner, a set of flags 24 is utilized to record the occurrence of failure events. Finally, a set of counters 22 and flags 23 are combined and utilized to record the point at which a harvest event occurs and the fact that a harvest event occurred, respectively. Bargh et al. also state that in one embodiment a cycle number is captured and stored utilizing counters 22 and flags 23 to record a harvest event. The logic structures of instrumentation logic block 20 are created without direct intervention by the user.

Incorporated by reference herein in their entirety are the following references:

U.S. Pat. No. 5,920,490 granted to Peters on Jul. 6, 1999 and entitled "Integrated circuit test stimulus verification and vector extraction system."

U.S. Pat. No. 5,544,067 granted to Rostoker, et al. entitled "Method and system for creating, deriving and validating structural description of electronic system from higher level, behavior-oriented description, including interactive schematic design and simulation"

Also well known in the art is the use of a bitmap to indicate the status of information being held in blocks of memory. Specifically, the bitmap indicates whether or not information that is temporarily held in a cache has been changed in main memory. For example, a bitmap may contain one bit for each block (e.g. 1 page) of main memory. Whenever any information stored within a memory block in main memory is changed, a bit corresponding to that memory block is "dirtied" (i.e. changed from valid to invalid) within the bitmap. Any future access to the temporarily held information in a cache requires fetching of the newly-updated information from the memory block in main memory because of the "dirtied" bit in the bitmap. After such an access the "dirtied" bit is cleared thereby to indicate that the temporarily-held information in the cache is now current (until information in main memory changes).

To the inventor's knowledge, such a bitmap has been used in the prior art only in the context of representing the status of information in each of a number of blocks in main memory that are contiguous with one another and homogenous in all respects. In such a bitmap, a first bit indicates the status of information in a first memory block, and a second bit indicates the status of information in a second memory block and so on. Such a prior art bitmap summarizes only the state of a single, homogenous, contiguous memory. Moreover, to the inventor's knowledge, the prior art teaches use of only a single bitmap of the type described above.

Also known in the prior art is the use of a dirty/polling bit associated with an emulated register/memory to indicate whether its value is changed. This prior art method is not efficient on polling the changed memories/registers. However, to have one polling bit associated with each monitored resource is inefficient. To poll for triggered resource, an application needs to go through polling bits one by one.

Some prior art implementations use a linked list to record all changed memories/registers. This prior art method is more efficient than the above-described prior art method, but not flexible, and not scalable. The linked list of these prior art implementations must be processed immediately after each simulation step and cannot be used for applications requiring multiple different kind of monitor devices for the same memory/register. To use a linked list to list all triggered resources is not flexible and not easy to adapt for multiple monitoring applications. The triggered linked list must be processed together. This prevents the possibility of having applications to poll for triggered resources at different moments. Also, the use of linked list is not efficient when a resource may get triggered multiple times before the application does the polling. Moreover, before a triggered resource can be added into the linked list, it must check if it has already been on the list to prevent duplication.

See also Chapter 3 entitled "The Buffer Cache" in a book entitled "The Design of the Unix Operating System", Maurice J. Bach, Prentice-Hall, Inc. 1986, ISBN 0-13-201799-7 025, pp. 38–58. In this reference, Bach describes a similar scheme for maintaining a file system buffer cache.

SUMMARY

In accordance with the invention, a resource (modeled by simulation or emulation) is associated with a number of memory locations (also called "monitoring memory locations") for a corresponding number of applications that are interested in monitoring the resource. In several embodiments of the invention, whenever the resource is accessed, all monitoring memory locations associated with that resource are updated to indicate that the resource was accessed. Any interested application may independently read its own individual monitoring memory location at any time, to find out if the resource was accessed.

Monitoring memory locations of the type described above may be allocated in main memory by either a simulator or by applications, depending on the embodiment. In some embodiments, prior to start of monitoring, a pointer to a number of monitoring memory locations are provided by the simulator to an application that is interested in each of a corresponding number of resources. The same pointer is also added to a group of pointers that are associated with each resource being monitored by the application. Thereafter, whenever a resource is accessed, the simulator uses pointers in that resource's group, to update the monitoring memory locations of each of a number of applications interested in that resource.

In certain embodiments, a bitmap is also associated with each application. The bitmap provides a summary of change in status of any of a number of different resources that a given application has expressed interest in monitoring. Bits are allocated within such a bitmap, one bit for each monitoring memory location for the given application. Such a bit is set at the time the corresponding monitoring memory location is updated (i.e. when the corresponding resource is accessed). Bits in the bitmap are cleared when the application reads the corresponding monitoring memory locations.

Just checking the bitmap as a whole (e.g. checking a value in a 32 bit or 64 bit register) informs an application if there is any change in any monitoring memory locations of that application. Moreover, the application may use individual bits of the bitmap to identify (and cycle through) only those monitoring memory locations that have changed. Hence, the just-described bitmap for each application summarizes the state of a number of resources. Thus the state of a number of different heterogeneous devices, such as registers, memories, logic blocks and peripheral devices that are of interest to that particular application is summarized in a single bitmap for each application.

In contrast, the prior art bitmap described in the "Background of the Invention" section above merely summarizes the state of a single, homogenous, contiguous memory. Furthermore, any number of applications in accordance with the invention can individually contain their bitmaps that respectively identify the status of resources of interest to those particular applications. As noted above, in some embodiments, the bitmap of each application forms a portion of a "monitoring set" that also contains the monitoring memory locations. In several such embodiments, the applications are not provided pointers to the individual monitoring memory locations and instead, a single pointer to a monitoring set as a whole is provided to the application, and the application accesses data within the monitoring set (such as the bitmap and/or individual monitoring memory locations) through methods that are associated with the monitoring set.

Moreover, in one such embodiment, resources that are native (such as registers and memory) are hidden from software programs (in an object oriented language) that normally operate on the resources. Instead, each resource and all monitoring sets that indicate status of that particular resource are wrapped up into a single object on which the software programs perform their normal operations with the following difference. Access to a resource (e.g. reading or writing of a register) and the update of all monitoring memory locations that indicate status of that resource are together implemented via overloading of operators that are normally used by software programs to access the resource.

Specifically, in the just-described embodiment, certain operators, for example an increment operator "++" and an addition operator "+=", that are native to an object oriented programming language such as C++, (and that are normally used to change a value stored in a register) are replaced with corresponding functions. The corresponding functions not only perform the traditional functions (of incrementing and assigning respectively) on the resource but also update the associated monitoring memory location of each application that has expressed an interest in monitoring the resource.

BRIEF DESCRIPTION OF THE DRAWINGS

FIGS. 3B and 3C illustrate, in flow charts, acts performed by a simulator and by an application respectively.

DETAILED DESCRIPTION

In several embodiments of the invention, a computer 200 (FIG. 2A) is programmed with software (called "simulator") 220 to simulate a number of resources 220A–220P, wherein $A \leq I \leq P$ and P is the total number of resources being simulated. The simulated resources 220A–220P may communicate with one another depending on a design of hardware that is being simulated. For example, resource 220A accesses resources 220B and 220P in the normal manner.

Specifically, resource 220A may include logic (not shown) to read data from and/or write data to resource 220B. Depending on the embodiment, resource 220A may include a microcontroller that is programmed with software to operate on such data. Also depending on the embodiment, resource 220B may include either logic/storage or both (labeled as 222 in FIG. 2A). In the following discussion, resource 220B is assumed to receive and respond to accesses from one or more other resources, such as resource 220A.

Figure 1:
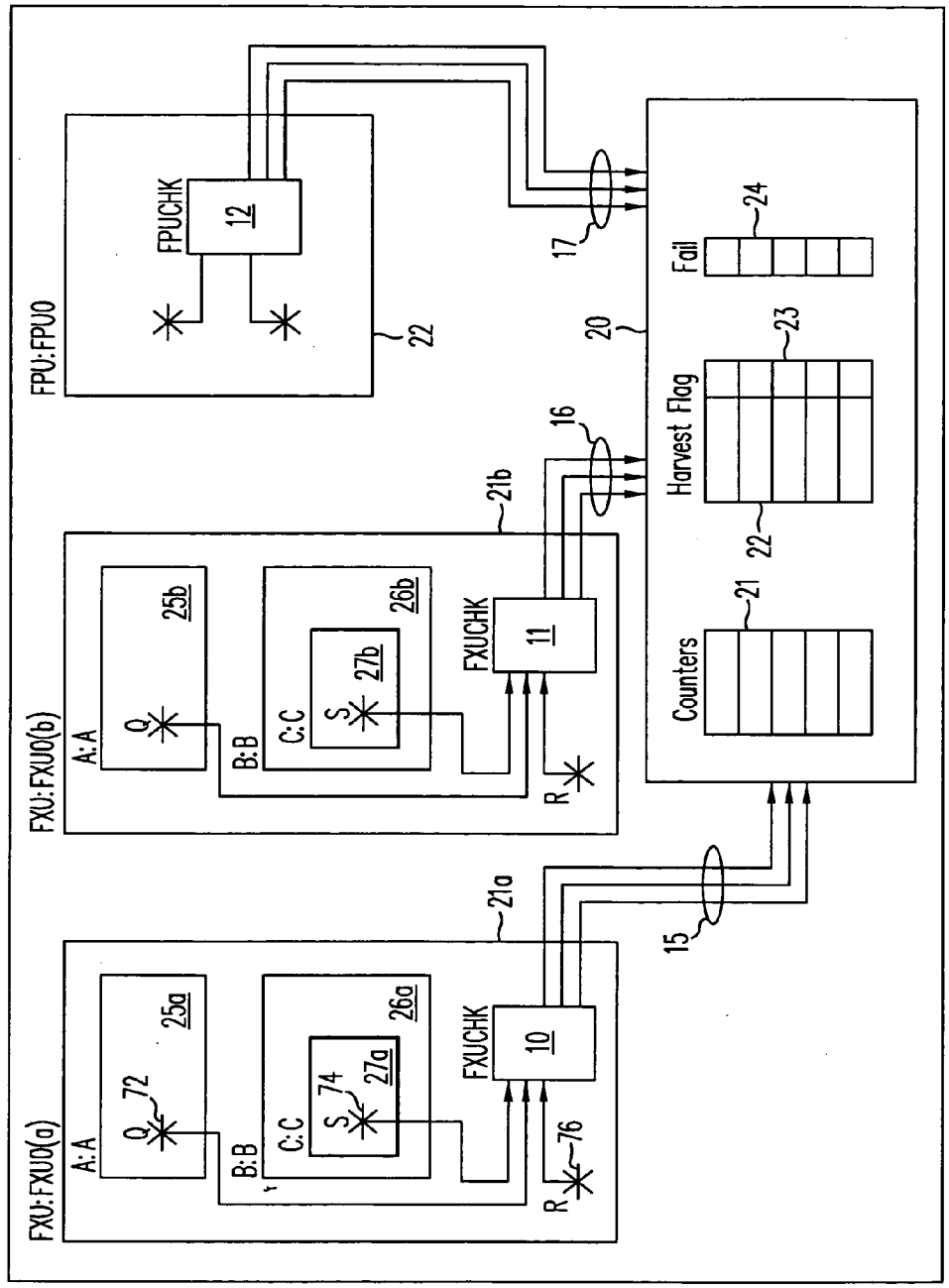
FIG. 1 illustrates a prior art mechanism for monitoring resources.
Figure 2A:
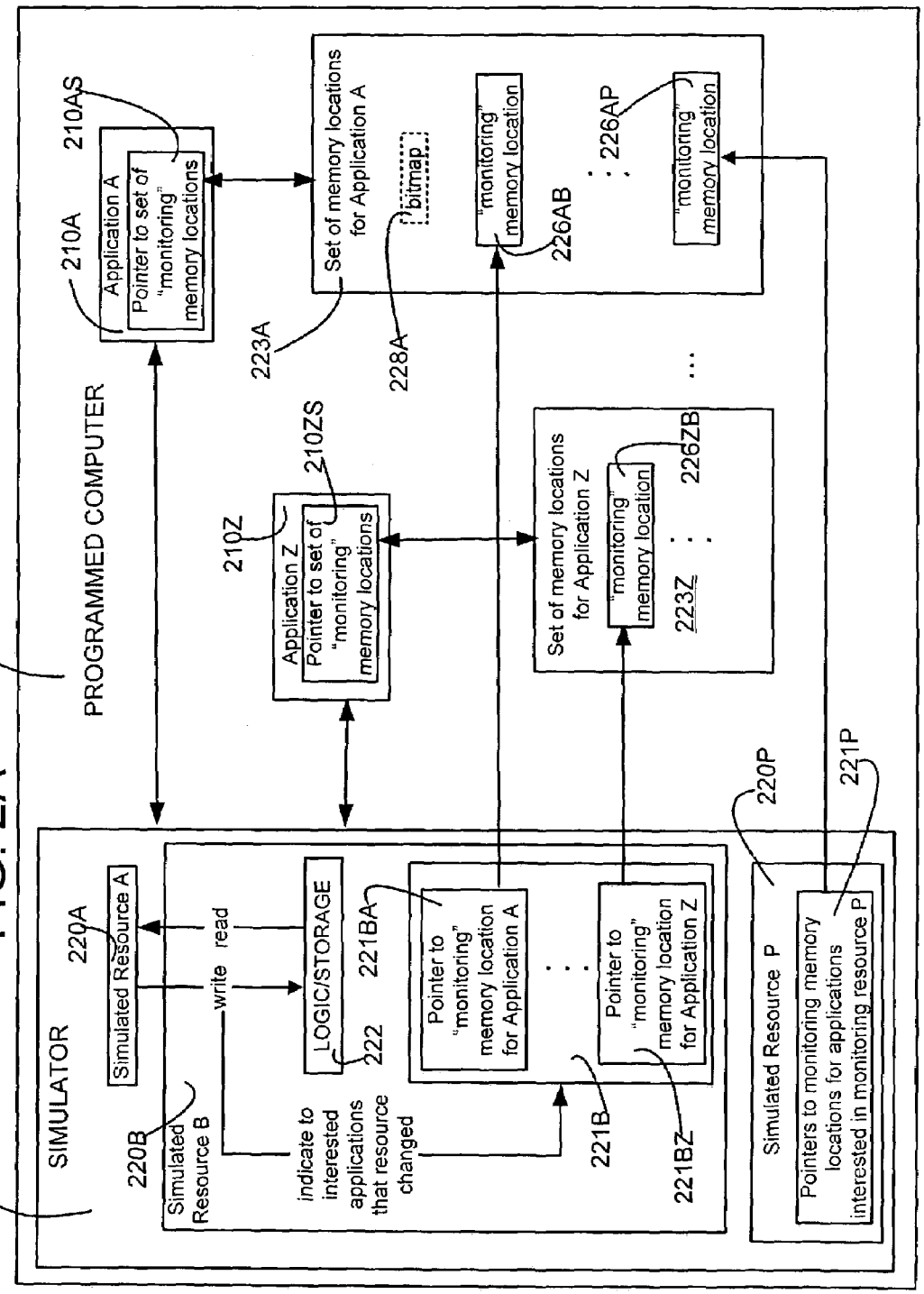
FIG. 2A illustrates, in a high level block diagram, data maintained by a simulator in accordance with the invention.

As illustrated in FIG. 2A, in addition to logic/storage 222 that is being simulated by simulator 220, resource 220B also has associated therewith a group 221B of pointers 221BA–221BZ, wherein $A \leq J \leq Z$, and Z is the total number of pointers associated with resource 220B. Each pointer 221BA–221BZ in group 221B identifies a memory location (also called "monitoring memory location") for a corresponding one of a number of applications 210A–210Z.

Applications 210A–210Z are entities (e.g. software programs that execute in computer 200) that have expressed an indication of interest in monitoring resource 220B. Each of applications 210A–210Z may also have expressed an indication of interest in monitoring one or more other resources being simulated by simulator 220. For example, FIG. 2A illustrates that application 210A has expressed an interest in monitoring resource 220P. For this reason, monitoring resource 220P has associated therewith a group 221P that includes a pointer that identifies another monitoring memory location 226AP for application 210A.

In the embodiment illustrated in FIG. 2A, the monitoring memory locations are organized into sets, with one set for each application. For example, application 210A has a set 223A containing monitoring memory locations that identify status of resources of interest to application 210A. Similarly, application 210Z has a different set 223Z of monitoring memory locations.

When multiple applications express an interest in monitoring the same resource, multiple monitoring memory locations are maintained by simulator 220, with one monitoring memory location for each application. All monitoring memory locations whose pointers are identified in a group associated with a resource are updated (as per act 232 in FIG. 2B) whenever an access is made to that resource (as per act 231 in FIG. 2B). For this reason, FIG. 2A illustrates two monitoring memory locations for two applications 210A and 210Z, namely monitoring memory location 226AB and another monitoring memory location 226ZB respectively. Both monitoring memory locations 226AB and 226ZB are updated (as per act 232 in FIG. 2B) when resource 220B is accessed (as per act 231).

Depending on example, an update that is made to monitoring memory location 226AB may be same as or different from the update to monitoring memory location 226ZB. In a first example, application 210A is interested only in write accesses to resource 220B, and hence monitoring memory location 226AB is updated only when a write operation is performed to resource 220B but not updated when a read operation is performed to resource 220B. To implement such conditional update, a check may be made between acts 231 and 232 described above, e.g. the simulator may check whether the access is a write access (as per act 233 in FIG. 2B) and skip the update if the answer is no. In the just-described first example, if application 210Z has expressed an interest in monitoring all accesses to resource 220B, then monitoring memory location 226ZB is updated when a read operation or a write operation is performed to resource 220B.

Note, however, in a second example, both applications 210A and 210Z express an identical interest in monitoring write accesses to resource 220B, in which case both monitoring memory location 226AB and 226ZB are updated (or not updated) in response to each access to resource 220B (depending on whether the access was a read or write access). In the just-described second example, applications 210A and 210Z access their respective monitoring memory location 226AB and 226ZB independent of one another. Therefore, it is possible for an application 210A to have cleared a previously-stored value in its monitoring memory location 226AB. In such a case, monitoring memory location 226AB has a different value than monitoring memory location 226ZB, even though in this second example both monitoring memory locations 226AB and 226ZB are updated at the same time, i.e. whenever there is a write access to resource 220B.

Each application can check whether or not any resource that it is monitoring has been accessed by simply checking a monitoring memory location that is updated when that particular resource is accessed. For example, application 210A (FIG. 2A) can check whether or not resource 220P has been accessed simply by looking up a value held in monitoring memory location 226AP.

In certain embodiments, set 223A includes a bitmap 228A that is maintained to provide a summary of change in status of any of a number of different resources 220A–220P that application 210A has expressed interest in monitoring. Bits are allocated within such a bitmap 228A, one bit for each of monitoring memory locations 226AB–226AP in set 223A. Such a bit is set in the bitmap at the time that the corresponding monitoring memory location is updated (i.e. when the corresponding resource is accessed). Bits in bitmap 228A may be cleared when application 210A reads the corresponding monitoring memory locations.

In the just-described embodiments, simply checking bitmap 228A as a whole (e.g. checking a value of a 32 bit register or a 64 bit register) informs application 210A if there is any change in any of monitoring memory locations 226AB–226AP for application 210A. Moreover, application 210A may use individual bits of bitmap 228A to identify (and cycle through) only the specific monitoring memory locations that have changed. Hence, the just-described bitmap 228A summarizes the state of a number of resources 220A–220P that are being monitored by application 210A. Thus the state of a number of different heterogeneous devices 220A–220P, such as registers, memories, logic blocks and peripheral devices, that are of interest to a particular application 210A is summarized in a single bitmap 228A.

Note, however, that a bitmap 228A need not be used in all embodiments. For example, instead of associating individual bits of a bitmap with each monitoring memory location in a set for an application, in another embodiment a nibble is associated with each monitoring memory location. A single word (e.g. of 32 bit length or 64 bit length) is used to hold all such nibbles, and the single word provides summarized status in a manner similar to a bitmap. Such summarized status (whether or not implemented by a bitmap), can be used by an application to cycle through only the resources that have been accessed (i.e. the resources that have been not accessed are skipped). Furthermore, in yet another embodiment, there is no summarized status at all. Instead, application 210A is programmed to check if any of the resources of interest to itself have changed status by checking one at a time each of the monitoring memory locations 226AB–226AP included in set 223A.

Figure 2C:
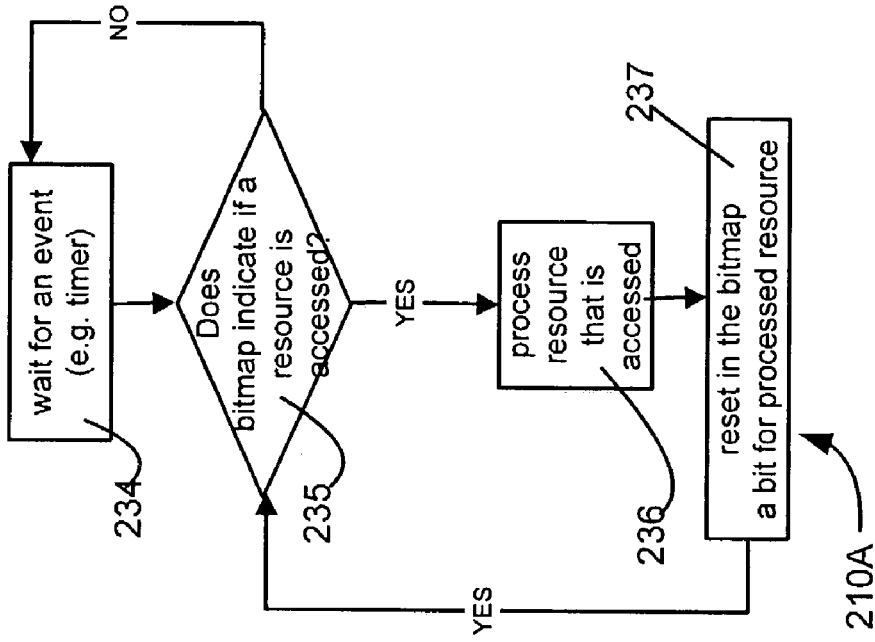
FIG. 2C illustrates, in a flow chart, acts performed by an application that monitors a resource of the type illustrated in FIG. 2A.
Figure 2B:
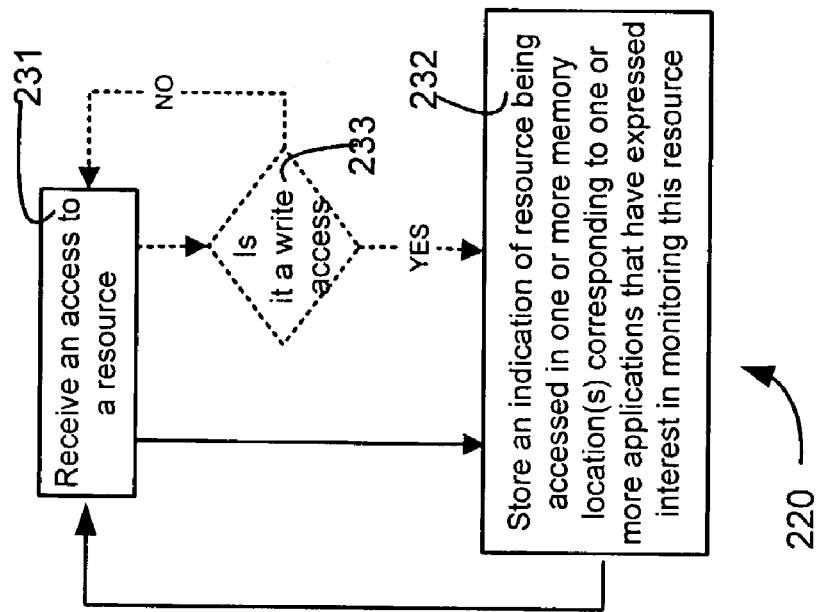
FIG. 2B in a flow chart, acts performed in response to accessing a resource of the type illustrated in FIG. 2A, to update a number of memory locations of a corresponding number of applications that are interested in monitoring that resource.

Depending on the embodiment, an application 210A may initially wait for an event, such as a timer, as per act 234 (FIG. 2C). Thereafter, application 210A uses bitmap 228A to check if any resource of interest to application 210A has been accessed (as per act 235 in FIG. 2C). If no resource of interest has been accessed, application 210A returns to act 234. If the bitmap 228A indicates that a resource has been accessed, then application 210A goes to act 236 and processes the resource. The processing done by application 210A can be, for example, display of a new value of a resource being monitored, in a window 256 on a video display 254 (FIG. 2D) of computer 200.

Referring back to FIG. 2C, after processing of a value of an accessed resource in act 236, application 210A clears (in act 237) a bit that is set in bitmap 228A for the resource that has been processed, and thereafter returns to act 235 (described above). In this manner, use of bitmap 228A allows application 210A to only process resources of interest to application 210A and that have been accessed since the last time the timer (or other event) occurred.

In certain embodiments, a monitor object contains a method which tests and resets an entry in bitmap 228A when invoked by the application 210A. Such an object may be implemented as a part of a simulator of the type described herein in which case application 210A sends a message to the simulator to invoke the method. Alternatively, in other embodiments, such a method may be implemented in executable code (from a library) linked with application 210A so that there is no need to send a message to invoke this method.

Although certain embodiments implement the acts illustrated in FIG. 2C, as will be apparent to the skilled artisan, other embodiments may implement other acts. For example, in one specific embodiment that is described below in detail in reference to FIGS. 3A and 3B, each application uses a method that identifies a first resource that has been accessed (implemented as a function "first_triggered"), and another method that identifies the next resource that has been accessed (e.g. such methods may be invoked in a "for" loop of the type well known in the art).

Figure 3A:
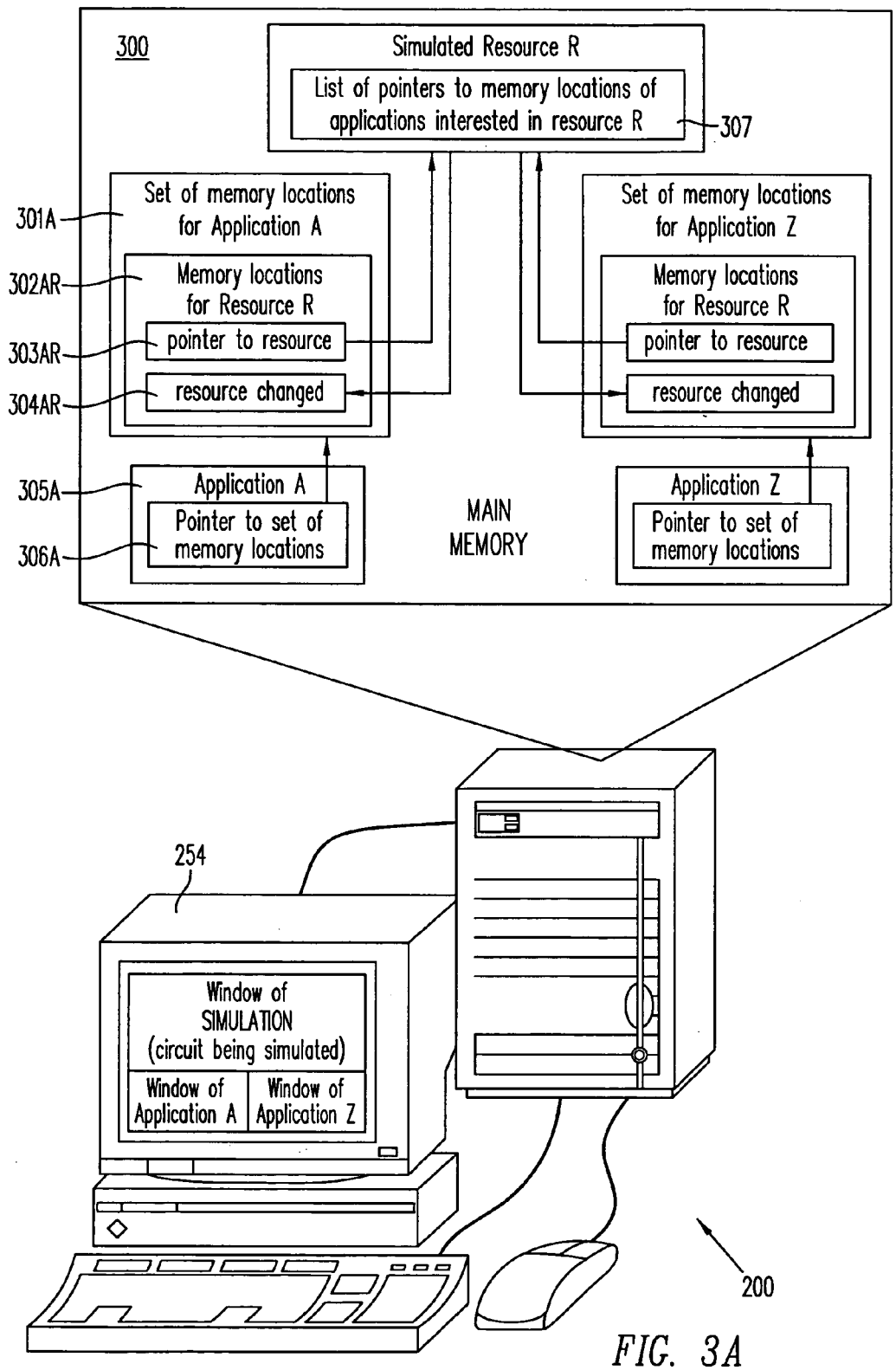
FIG. 3A illustrates, in a block diagram, a computer that is programmed in accordance with the invention to inform a number of applications that are interested in monitoring a resource being modeled, whenever there is an access to that resource.

Referring to FIG. 3A, a set of memory locations 301A for a corresponding application 305A may be allocated in a main memory 300 of computer 200, by either the simulator or the application 305A. After allocation, pointers to the allocated memory locations are saved (e.g. for future use when accessing the resource and also for future use by the application interested in monitoring the resource). For example, a pointer to memory locations 302AR is saved in a list 307 of such pointers that is maintained for resource R. Memory locations 302AR not only contain a monitoring memory location 304AR which indicates that the resource has been accessed and changed, but also a pointer 303AR to the resource R, so that the value that has changed can be retrieved by application 205A. As previously noted, application 305A contains a pointer to a set of memory locations 301A (which includes memory locations 302AR) that are maintained for application 305A.

Numerous modifications, adaptations and variations of the embodiments described herein will be apparent to the skilled artisan in view of the disclosure. For example, in some embodiments a single pointer to a set 301A as a whole is provided to application 305A. Such an application 305A may be programmed to access data within the monitoring set (such as a bitmap and/or individual monitoring memory locations) through one or more methods that are associated with the set. Alternatively, in some embodiments, a pointer to the monitoring memory location 304AR is itself provided to application 305A (i.e. instead of a pointer to the set 301A). In the alternative embodiments, the same pointer is also added to list 307 associated with the resource R being monitored.

In an embodiment illustrated in FIGS. 3B and 3C, a simulator 340 allocates a location in memory for use as a monitoring memory location, in response to an indication of interest in monitoring a resource from an application 330 as discussed next. Specifically, application 330 informs the simulator (as per act 331 in FIG. 3B) of its interest in monitoring any changes in one or more resources that are explicitly identified by application 330 (e.g. resource R). Thereafter, as illustrated by act 332, application 330 receives a pointer to a set of memory locations that will hold an indication regarding a change in the resource(s) of interest. Such a set also contains a bitmap of the type described above, in some embodiments.

Referring to FIG. 3C, simulator 340 of this embodiment receives the indication from application 330 in act 341 (FIG. 3C). Thereafter, in act 342, simulator 340 if a set of memory locations has not previously been associated with this application 330 then simulator 340 supplies a pointer to the set that is to be used in future to indicate that resources of interest to this application 330 have changed. Next, in act 343, simulator 340 allocates a memory location (also called "monitoring memory location") to indicate change in the resource identified by the application. Thereafter, in act 344, simulator 340 adds the address of the allocated memory location to a list of pointers of memory locations that are to be updated when the identified resource changes value. In some embodiments, simulator 340 also allocates another memory location, and initializes this memory location with the address of the resource being monitored.

After the above-described initial setup, the monitoring memory location is used in a manner similar or identical to that described above. Specifically, whenever the simulator receives an access to a resource being monitored (as per act 345), the simulator 340 checks if the access is a write access (as per act 346) and if no returns to act 345 and if yes goes to act 347 to update all the monitoring memory locations that have been associated with this resource. At this time simulator 340 also updates the bitmap of each application to indicate the change in resource. Application 330 uses the bitmap to identify the first resource that has changed (as per act 333) and uses the address of the resource to look up the new value of the resource (as per act 334). Moreover, application 330 uses the bitmap to identify if there is another resource that has changed (as per act 336), and if so returns to act 334 else waits for the next iteration.

Figure 4:
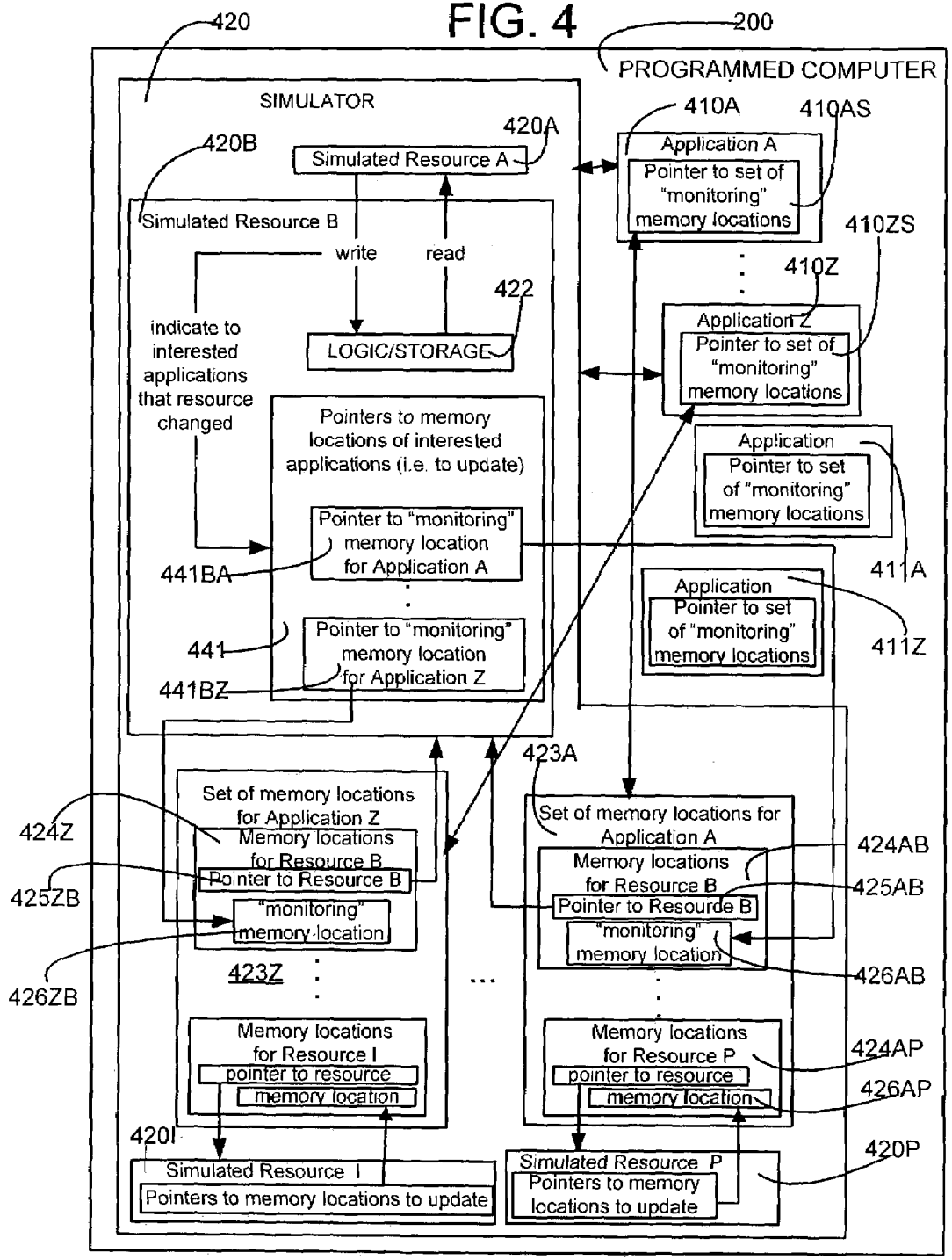
FIGS. 4–6 illustrate, in block diagrams, various embodiments of a programmed computer in accordance with the invention.

FIG. 4 illustrates another embodiment that is similar to the embodiment described above in reference to FIG. 2A. In FIG. 4, many of the reference numerals are obtained by adding 200 to the reference numerals of corresponding items in FIG. 2A. Note that there may be any number of applications, such as applications 411A–411Z that execute in computer 200 and such applications have not expressed an indication of interest in monitoring resource B. Note also that application may express an indication of interest in monitoring other resources, e.g. application 410A has expressed an interest in monitoring resources 420B and 420P. And one or more applications may not be interested in one or more resources, e.g. application 410A has not expressed interest in monitoring resource 420I. For this reason set 423A for application 410A contains only the memory locations 424AB and 424AP for the corresponding resources 420B and 420P.

Figure 5:
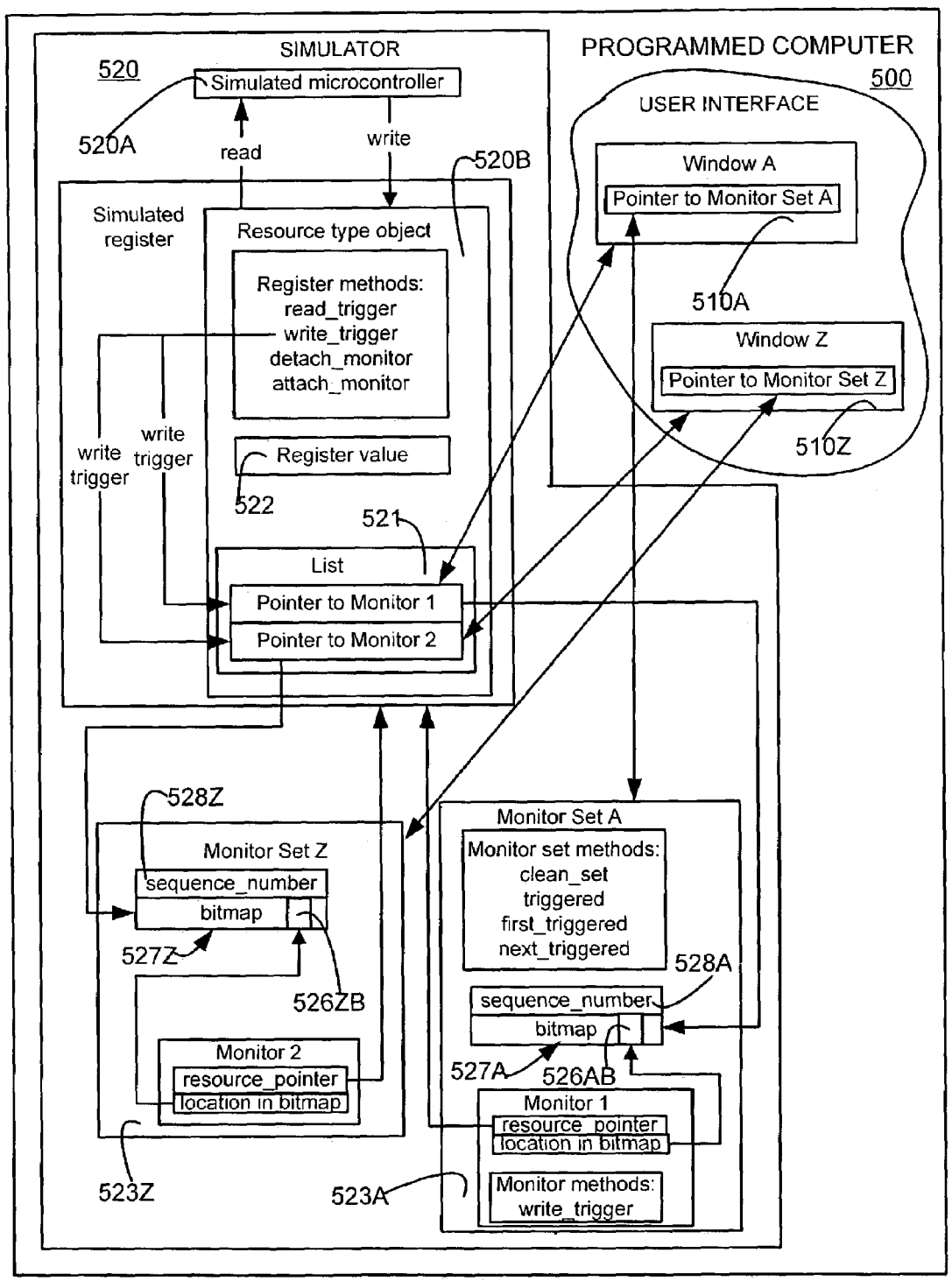
Figure 6:
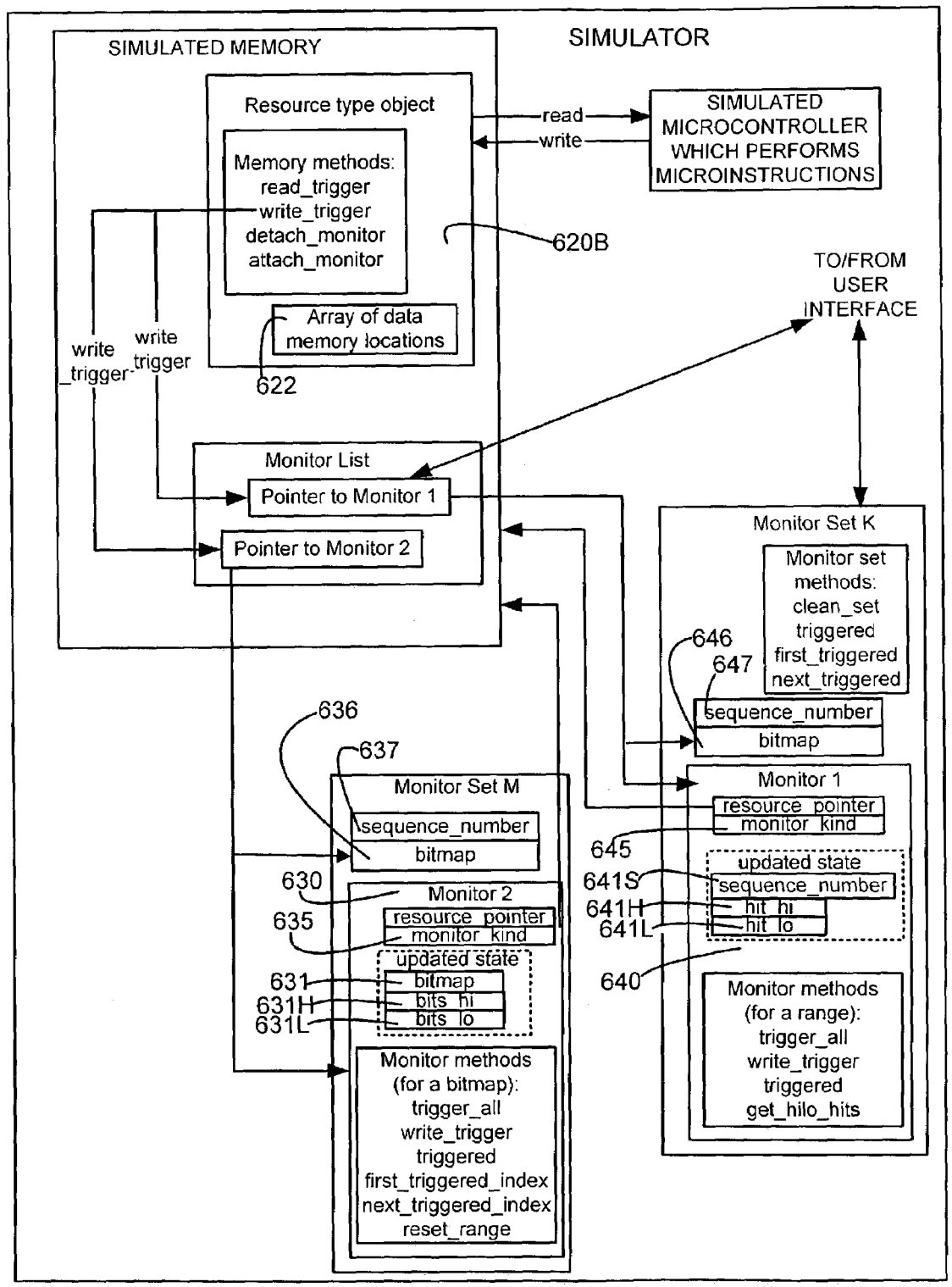

FIGS. 5 and 6 illustrate another embodiment in which resources that are native (such as registers and memory) are hidden from software programs (in an object oriented language) that normally operate on the resources. Specifically, a register 522 (FIG. 5) that is being simulated, and a list 521 of pointers to all monitoring sets that indicate status of that particular register 522 are wrapped up into a single object 520B. Note that instead of a list, an array can be used to hold the pointers in object 520B.

In one embodiment, object 520B is an instantiation of a class "RsrcType" which contains the following member data items (see file RESRCHH.TXT):

| | | |
|---|---|---|
| Uint | id_m; | // resource id number |
| RsrcDescrPtr | descr_m; | // resource's description |
| Resources | &rsrcs_m; | // reference to resource database |
| RsrcMonitor | *state_mon_m; | // state monitor (if any) |
| MonList | monitors_m; | // monitors attached to this resource |

The data item monitors_m includes a forward linked list of all pointers to objects called "monitors" that contain monitoring memory locations to be updated when this resource is accessed. In this embodiment, data item monitors_m is of type MonList which is typedefined in file RESRCHH.TXT to be "list" of C++ standard library container class. Note that the just-described list of pointers is known only to the class "RscrType" and is otherwise hidden from other entities (such as applications) in programmed computer 500.

Software programs executed by a microcontroller 520A (that is also being simulated) perform operations on simulated register 522 as follows. Specifically, one or more operators (e.g. operators ++ and +=) that are normally used by software programs to change register 522's value are overloaded by use of a method (called "write_trigger") that is invoked in this embodiment. Note that although described in terms of a simulated microcontroller 520A, as would be apparent to the skilled artisan, one or more applications that are not part of simulator 520 may also access a simulated register as described herein.

Method write_trigger not only changes the value currently held in register 522 but also performs an update of two monitoring memory locations 526AB and 536ZB that are the only two such locations in list 521. Specifically, a write_trigger is generated for each of the monitors in the list 521. A similar method read_trigger is used when reading the current value of register 522. In certain embodiments, methods write_trigger and read_trigger are implemented as methods of a class elementType that is illustrated in the files ELETYPCC.TXT and ELETYPHH.TXT.

In the example illustrated in FIG. 5, the two monitoring memory locations 526AB and 526ZB are implemented as two individual bits in two bitmaps, although such locations can be implemented by any size memory locations. In this example, individual bits 526AB and 526ZB are sufficient to indicate a change in status of a scalar resource such as a register, although additional memory locations may be used for larger resources (e.g. a vector resource such as a memory, as described below in reference to FIG. 6).

Depending on the embodiment, list 521 may either contain pointers to individual bits 526AB and 526ZB (e.g. a pointer to a bitmap with an offset for a location of a bit in the bitmap), or alternatively pointers to monitors, wherein the monitors contain an offset within the bitmap to identify the location of the bit of interest, and a set that contains the monitors also contains the bitmap to be updated.

Method write_trigger may be implemented to increment a sequence number 528A and 528B that is included in each of sets 523A and 523Z (which are also referred to as "monitor sets"). Such a sequence number 528A is compared by an application 510A with a previously-retrieved sequence number (for this set 523A). If the numbers do not match, then any data that was previously read by application 510A has changed, and therefore application 510A fetches the bitmap 527A and parses the bitmap to identify resources of interest that have changed. If the sequence number is unchanged these acts are skipped by application 510A (i.e. its previously read data is still valid). Use of the sequence number eliminates the need for an application to step through and reset each monitoring memory location.

The above-described write_trigger method iterates over each monitor identified in the list 521, and in turn invokes another method (also called "write_trigger") of each monitor as shown in the file RESRCCC.TXT:

```
void RsrcType::write_trigger( U64 old_v, U64 new_v, Uint idx, Uint
eid )
{
    // trigger monitors attached to this resource
    //
    MonListIter mon_iter;
    for ( mon_iter = monitors_m.begin( ); mon_iter !=
    monitors_m.end( ); ++mon_iter ) {
        (*mon_iter)->write_trigger( old_v, new_v, idx, eid);
    }
}
```

The above code contains a for loop that goes through the list of monitors that are attached to the current resource, and on each monitor it invokes the write_trigger method. It is the write_trigger method of each monitor that performs the update (e.g. by changing a single bit in the bitmap of the monitor set) as discussed below. Note that although the same method write_trigger is invoked for each monitor, the update that is actually performed within each monitor may differ, depending on a number of factors, such as the kind of monitor (discussed below).

In addition to the above-described read_trigger and write_trigger methods, object 520B also supports two additional methods namely attach_monitor and detach_monitor which operate on the above-described list 521. Namely, a pointer to an application's monitoring memory location is added by method attach_monitor, and the added pointer is removed by method detach_monitor.

Referring to FIG. 5, a monitor set supports the following methods: clean_set, triggered, first_triggered, and next_triggered. Method clean_set changes all bits in the bitmap to value zero. Method triggered indicates if any bit in the bitmap has value one. Method first_triggered returns the location of a first bit in the bitmap that is of value one. Method next_triggered returns the location of a next bit in the bitmap that is of value one. To return the next bit, method next_triggered maintains a pointer to the current location in the bitmap. This current location is reset by method first_triggered to be same as the location of the first bit of value one. Note that an application uses methods first_triggered and next_triggered to iterate over only the resources that have changed, e.g. if there are 100 resources that are being monitored and if only 6 of them have changed value, then the application iterates over only the 6 that have changed.

Furthermore, a monitor in the just-described monitor set for register 522 supports a method write_trigger which changes a single bit in the bitmap of the monitor set, to indicate that the register value has changed. The method write_trigger for a monitor may use an identifier in the monitor of a location in the bitmap of a monitor set, when setting the appropriate bit. An exemplary method write_trigger for a monitor is as follows (see RESRCCC.TXT):

```
void RsrcMonitor::write_trigger( U64 /*old_v*/, U64 /*new_v*/,
Uint idx, Uint eid )
{
    // NOTE: This is a minimal implementation of write_trigger( ) which
    //     triggers on any write. The full implementation will trigger
    //     conditionally based on the full monitor object. |
    // element id number (or zero) of resource that fired trigger must
    // match the monitor's field id
    //
    if ( rsrc_elem_m || (rsrc_elem_m == eid) ) {
        if ( ( (is_hilo( ) || is_range( )) && idx >= rsrc_m->size( ) ) {
            // internal error, index out of range
            throw SimAbort( abort_unexpected );
        }
        if ( is_hilo( ) ) {
            if ( mon_set_m.hilo_seq_no( ) != hit_seq_m ) {
                hit_lo_m = hit_hi_m = idx;
                hit_seq_m = mon_set_m.hilo_seq_no( );
            } else {
                hit_lo_m = (idx < hit_lo_m)? idx : hit_lo_m;
                hit_hi_m = (idx > hit_hi_m)? idx : hit_hi_m;
            }
        } else if ( is_range( ) ) {
            if ( (idx >= bits_lo_m) && (idx <= bits_hi_m) ) {
                (*bits_m)[idx - bits_lo_m] = true;
            }
        }
        mon_set_m.trigger( mon_id_m );
    }
}
```

In one example, an application uses a memory with 11 elements numbered 0–10 and if the monitor is of hi-lo kind (i.e. not bitmap kind), then the sequence number in the monitor is started at 0. Thereafter, the monitor is attached to the memory resource. At this time the hi and lo values are both undefined. This monitor is part of a set which contains its own sequence number, that is set to 1. Note that the set's sequence number is never set to zero and always starts at 1 so that all the monitor sequence numbers indicate that the data in the monitors is invalid (i.e. there is no need to reset the monitors).

Next, suppose a write operation is performed on location 3 in the memory resource. This write operation causes a write_trigger method to iterate over a list of all pointers to monitors that is currently resident inside the memory object. As noted above, the write_trigger method inside each monitor is invoked. Inside the monitor, the above-listed source code checks if the monitor is of hi-low kind (and in this case 1 is not equal to 0), and hence at this stage the hi and lo values are set to be same as one another and equal to the location number 3 that is currently being accessed. At this time, the sequence number in the monitor is changed to be same as the sequence number of the set itself. This last act ensures that the monitor has the same sequence number, and hence data is valid in the monitor.

In this example, the next operation is to write to memory location 5, and in this case the sequence numbers match, and hence each of hits_hi and hits_lo are individually updated as follows. Hits_lo was 3 and is left at that same value 3. Hits_hi was 3 but is now set to 5. Therefore, the range 3–5 is now marked as having changed values (note that the entire range has not changed, because there has been no change in the memory location 4; if a more accurate indication is desired, a bitmap must be used in an alternative embodiment).

In such an alternative embodiment for the above-described example, a bitmap has 11 bits, and in this case, bits_lo is set to 0 and bits_hi is set to 10. The bitmap together with the bits_hi and bits_lo is sufficient for an application to determine the updated state of a memory resource. In the alternative embodiment, the updated state of the memory resource is determined by the sequence number, hit_hi and hit_lo.

The kind of monitor (whether it uses a bitmap or whether it uses a range) is determined by the following function in the file RESRCHH.TXT:

```
bool is_range( ) const {
    return ( MON_IDX_RANGE == kind_m );
}
```

In the above-described example, the function is_range returns true, and then a comparison of the index 3 with bits_lo and bits_hi determines if this element falls within the range of locations that are being monitored. If this is true then one just checks the bitmap itself. Once the monitor is established, bits_lo and bits_hi are not changed, they are simply checked (in contrast hits_hi and hits_lo do change over time, depending on the access to the respective data memory locations). Source code for the just-described logic is in the file RESRCCC.TXT as follows:

```
if ( is_range( ) ) {
    if ( (idx >= bits_lo_m) && (idx <= bits_hi_m) ) {
        (*bits_m)[idx - bits_lo_m] = true;
    }
}
```

Once it is found that the data memory location that has been accessed is being monitored (as per the above logic), then a bit in the bitmap is updated as follows:

(*bits_m)[idx–bits_lo_m]=true;

Note that a bitmap of this example is addressed starting from bit 0 and for this reason, bits_lo is subtracted from idx in the above line of code before being used as an index into the bitmap. Therefore, the bitmap of this example is used to monitor a subrange within a memory (instead of monitoring the whole memory).

As noted elsewhere herein, a second bitmap is used in certain embodiments to identify if there is a change in any resource of interest to an application. The second bitmap contains one bit per monitor in a set of monitors for a given application. A bit in the second bitmap is changed as follows, as shown in the file RESRCCC.TXT (after updating the bit in the above-described bitmap of 11 bits):

mon_set m.trigger(mon_id_m);

The use of two bitmaps one for a monitor in a set and another for the set as a whole in the above described manner increases the speed with which an application can detect whether or not a resource of interest to the application has changed.

Note that a sequence number in a monitor set is updated only when an application requires hits_hi and hits_lo to be reset, e.g. so as to restart the monitoring. In one example, the application is a graphical user interface which displays the values of the various resources being monitored in a window. In this example, reset of the monitor set may need to be performed when the user requires values shown in the window to be re-displayed. Simply incrementing the sequence number by 1 eliminates the need to invalidate several hits_hi and hits_lo that are used for a number of monitors in the monitor set (because the sequence numbers that are used in each monitor are now stale—because the set's sequence number has been incremented).

Note that if the sequence number wraps (i.e. exceeds the capacity of the memory location that holds this number), then all the individual sequence numbers of each of the monitors are reset. Such a reset is required only once in $2^{32}$ increments of the monitor set's sequence number, assuming the memory location holds 32 bits.

In one such embodiment, the following method is invoked to reset all monitors in a set of an application (see RESRC-CC.TXT):

```
void RsrcMonitorSet::clean_set( )
{
    // clean all monitors in this set
    //
    bits_m->clear( );
        // invalidate array resource hi-lo hit cache
        //
        if (0 == ++hilo_seq_m) {
            // cache sequence number wrapped, reset all monitor
              sequence numbers
            //
            MonVectorIter mon_iter;
            for ( mon_iter = monitors_m.begin( ); mon_iter !=
              monitors_m.end( ); mon_iter++ ) {
                if ( (*mon_iter)->is_hilo( ) ) {
                    (*mon_iter)->invalidate_hilo( );
                }
            }
            // start sequence numbering at 1 (0 is never valid)
            //
            hilo_seq_m = 1;
    }
```

```
        // reset bitmaps in any array range monitors
        //
        if ( range_mon_m ) {
            MonVectorIter mon_iter;
            for ( mon_iter = monitors_m.begin( ); mon_iter !=
              monitors_m.end( ); mon_iter++ ) {
                if( (*mon_iter)->is_range( ) ) {
                    (*mon_iter)->reset_range( );
                }
            }
        }
}
```

Note that the above-described sequence number and the above-described bitmap need not be used in certain alternative embodiments, although such alternative embodiments would be slower than embodiments that use sequence numbers and bitmaps as discussed herein.

As would be apparent to the skilled artisan, the just-described bit values can be reversed in other embodiments (e.g. bit value 1 may be used in function clean_set, and bit values 0 may be used in functions first_triggered and next_triggered). For this reason, regardless of the actual values being 0 or 1, the term "inactive" denotes a bit that has been reset (e.g. by a call to function clean_set), and the term "active" denotes a bit that has been set (e.g. by a call to function write_trigger).

Referring to FIG. 6, a block of main memory is simulated in one embodiment by use of an object 620B that is also an instantiation of class "Resources" (described above). Note that object 620B contains an array 622 to hold data in a corresponding number of memory locations (also called "data memory locations") instead of the above-described one memory location 522 to hold a register value in object 520B.

Moreover, monitoring memory locations for such a memory resource being simulated are illustrated in FIG. 6 as being implemented by two different kinds of objects called "monitors." A first kind of monitor includes a bitmap 631 as the monitoring memory location for identifying whether or not simulated memory 620 has been accessed. Specifically, each bit in the bitmap 631 corresponds to a data memory location in array 622. An active bit in the bitmap 631 indicates that a value in the corresponding data memory location in array 622 has changed, and vice versa.

In certain embodiments, a monitor 630 includes not only the just-described bitmap 631 but also two additional memory locations, namely "bits_hi" location 631H which indicates the highest memory address in array 622 and "bits_lo" location 631L which indicates the lowest memory address in array 622. Note that in this embodiment, the address space contains addresses that monotonically increase from the value in "bits_lo" location 631L to the value in "bits_hi" location 631H, and the size of array 622 is the difference between these two values plus 1. Note that although in some embodiments the just-described address space is populated with memory, in other embodiments such an address space may be populated with other devices, such as peripheral devices (e.g. LAN interface devices).

The above-described monitor 630 can be used when the address space being monitored has a small size, because there must be one bit for each word in array 622 (i.e. bitmap 631 identifies each and every data memory location that has changed). A second kind of monitor 640 (also called "range monitor") uses a pair of monitoring memory locations 641H and 641L (called "hit_hi" and "hit_lo") that together indicate the boundaries of a range of addresses that have changed in the memory 620 being monitored. Specifically, "hit_hi" location 641H and "hit_lo" location 641L respectively indicate the highest address and the lowest address of locations in array 622 whose values have changed. In the embodiment illustrated in FIG. 6, a sequence number 641S in monitor 640 indicates whether or not there has been an update subsequent to the last time that this monitor 640 was checked and/or reset.

Additional memory locations (e.g. locations 635 and 645) may be used in each monitor to indicate the additional information about the monitors. For example an active value in location 635 may indicate the kind e.g. that monitor 630 contains a bitmap, or vice versa. Note that the status of monitors 630 and 640 may be summarized in individual bits of bitmaps 636 and 646 (of the type described above) that respectively summarize the status of any changes in any resources of interest to the respective applications. Furthermore, the status of change in all monitors for any given application may also be summarized in sequence numbers 637 and 647 (of the type described above). Specifically, sequence numbers 637 and 647 indicate whether or not there has been an update subsequent to the last time that each set of monitors was checked.

Since monitor 640 is a range monitor, it supports the following methods: trigger_all, write_trigger, triggered, and get_hilo_hits. Method triggered indicates if hit_hi is different from hit_lo and also different from the default. Method trigger_all triggers all locations if the monitor is for a memory resource, e.g. by changing hit_hi and hit_lo to the maximum and minimum values (e.g. the highest address and lowest address of the memory being modeled by array 622). Method write_trigger changes hit_hi to a current address if the current address (whose data memory location has a changed value) is higher than hit_hi. Method write_trigger changes hit_lo to the current address if the current address is lower than hit_lo.

Method triggered returns a Boolean value to indicate whether or not the monitor has been triggered. Method triggered may be implemented to check a bit in the bitmap 646 to decide whether or not even one data memory location in array 622 has changed. Method get_hilo_hits returns two indices, namely the lowest location and the highest location in array 622 that have changed (e.g. by returning hit_hi and hit_lo).

Monitor 630 is a bitmap based monitor which also supports the above-described methods trigger_all, write_trigger, triggered. In addition, monitor 630 supports the following methods: first_triggered_index, next_triggered_index, and reset_range which require a bitmap implementation. Method first_triggered_index returns the location of the lowest address data memory location in array 622 whose value has changed (e.g. by finding the first non-zero bit in a bitmap if the monitor is of a kind that uses a bitmap). Method first_triggered_index also resets a bit in bitmap 631 corresponding to the just-described location in array 622. Method next_triggered_index returns the location of a next data memory location in array 622 whose value has changed. Method next_triggered_index also resets a bit in bitmap 631 corresponding to the just-described location in array 622.

Method reset_range for monitor 630 resets all bits in bitmap 631. A method reset_range is not required for monitor 640 because advancing the sequence number 647 in monitor set K effectively resets all monitors of this type (i.e. range monitors) in monitor set K. Note that in addition to a range monitor, monitor set K may have one or more other kinds of monitors, such as the above-described bitmap monitor and a register monitor, depending on the embodiment.

In one embodiment, monitors 630 and 640 are instantiations of a class "RsrcMonitor" which contains the following member data items (see file RESRCHH.TXT):

| | | |
|---|---|---|
| RsrcMonitorSet | &mon_set_m; | // monitor set this monitor belongs to |
| Uint | mon_id_m; | // monitor ID number within it's set |
| RsrcSpec | spec_m; | // resource specification |
| RsrcType | *rsrc_m | // current monitored resource |
| U32 | rsrc_id_m; | // current monitored resource id number |
| Uint | rsrc_elem_m; | // current monitored resource element number |
| MonKind | kind_m; | // monitor kind |
| BitMap | *bits_m; | // monitor bitmap for MON_IDX_RANGE |
| Uint | bits_lo_m; | // start of bitmap monitor range |
| Uint | bits_hi_m; | // end of bitmap monitor range |
| Uint | bits_size_m; | // current size of monitor bitmap |
| Uint | hit_seq_m; | // hit range validity sequence number |
| Uint | hit_lo_m; | // low index hit for MON_IDX_HILO |
| Uint | hit_hi_m; | // high index hit for MON_IDX_HILO |
| bool | is_state_m; | // true if this monitor tracks state<br>// The resource caches a pointer back to<br>// this monitor that can then be checked<br>// for the dirty/clean state of the<br>   resource. |

As shown by the above definition of member data items, the same class is used in one embodiment to instantiate both monitors 630 and 640 discussed above. The appropriate methods (discussed above) are made available, depending on the monitor kind (e.g. bitmap monitor, range monitor or register monitor).

In certain embodiments, the above-described objects are used to accelerate monitoring of accesses to emulated memories and registers. In such embodiments, a monitor object of each monitoring application is linked to the monitored memory/register (the monitored resource). A monitoring application in these embodiments typically contains a set of monitor objects, and each object monitors one resource of interest to the monitoring application. To accelerate the polling of resources that have changed (also referred to as "triggered"), a bitmap is used. In several embodiments, the monitoring application accesses individual monitor objects only via a pointer to a monitor set as a whole. In such embodiments, the application may invoke a method "get_resource" to obtain the pointer of a resource that is being monitored, and then read a new value of the resource.

In some embodiments, each monitoring application contains a pointer to a single monitor set. Each monitor set contains a list of monitor objects and a bit map to indicate which monitor object is triggered. Each monitor object contains a link to the monitored resource and another link to a bit in a bitmap. The bitmap is of the monitor set to which the monitor object belongs. Furthermore, an object for each resource contains the resource itself, and a list of links to monitor objects monitoring this resource.

During operation, when a resource is accessed (e.g., gets written, or read), the simulator goes through all monitor objects that are monitoring this resource, to turn on their triggering bits. This is done in some embodiments using the C++ operator overload feature.

Any monitoring application may poll for triggered resources independent of another monitoring application. For example, to highlight data that has changed, it is only necessary to poll triggered resources after the simulation stops, whereas a trace function needs to trace changed values after each step of execution. Because each monitoring application has its own monitor set and triggering bitmap, each application can poll for triggered resources independently and only for resources in which it is interested. There is no checking of triggered resources after each step of execution in applications of the type described herein that only need to know about changed resources when simulation ends.

Regardless of when the polling is done for changed resources, use of the bitmap eliminates the need to check all resources. To poll for only triggered resources, the monitor set only checks the bitmap (in the monitor set). If the whole bit map is zero, there is no triggered resource. This kind of checking is much faster than polling each individual resource to find out which one is triggered. For example, one 64-bit comparison operation on a bitmap covers polling for 64 monitored resources. The performance gain, compared to a prior art implementation that uses only one polling bit associated with each resource, is about 64 times speed up with a 64-bit computer (e.g., Solaris workstation). Therefore, by use of a bitmap of the type described herein, each application can go through 64 polling bits as a whole, i.e. as group of 64.

Note that an issue with the prior art linked list that was noted in the background section above is eliminated by the bit map implementation in several embodiments because a triggering bit can be set multiple times without causing an error. The use of a bitmap in some embodiments also saves memory usage. Specifically, each monitored resource requires only one bit of memory in the bitmap, instead of a 32-bit pointer (in most platforms) used in the linked list prior art.

In certain embodiments, a simulator of the type described herein produces a trace of instruction execution (by a microcontroller) that enumerates each of a number of resources that have changed from one instruction to the next instruction. Because the monitoring facility in such embodiments is comprehensive (i.e. all resources are monitored and hence all resource changes are made visible), the list produced in the trace is also comprehensive.

Figure 7:
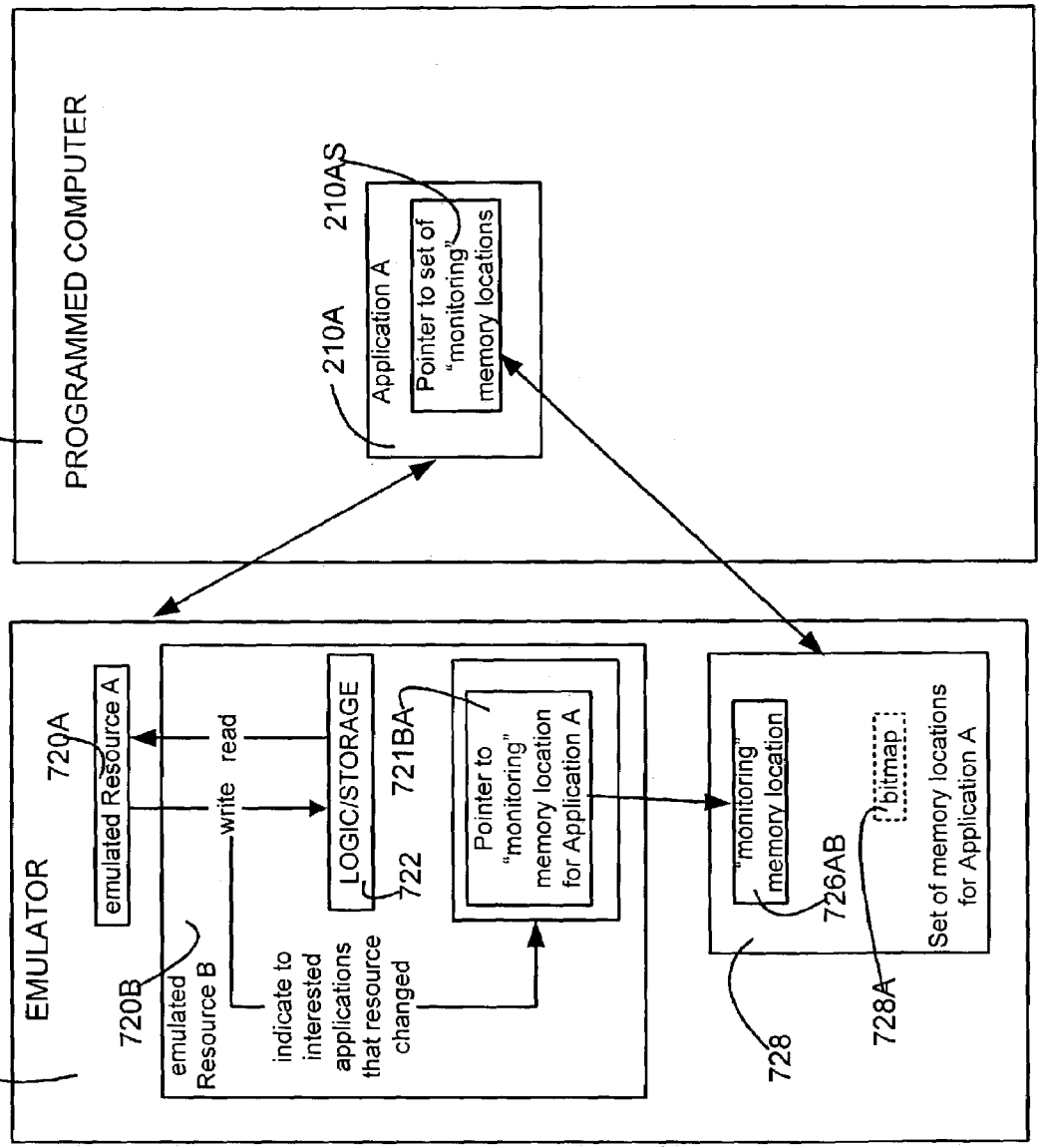
FIG. 7 illustrates, in a high level block diagram, data maintained by a hardware emulator in accordance with the invention.

Although in the above description certain resources are described as being modeled in a simulator, as would be apparent to the skilled artisan, one or more such resources may alternatively be modeled by an emulator (either in hardware or in software). Specifically, as illustrated in FIG. 7, computer 200 of the type described above can be used with a hardware emulator 720 in which certain resources 720A and 720B are emulated. Emulator 720 of this embodiment also implements a set 728 of monitors. Set 728 includes a monitor implemented as a monitoring memory location 726AB in response to interest expressed by application 210A in computer 200 to monitor emulated resource 720B.

Set 728 also includes a bitmap 728A which is used to identify to application 210A in a summary fashion whether one or more resources of interest to application 210A has changed. Note that implementation of bitmap 728A and monitoring memory location 726AB in hardware speeds up emulation by eliminating the need for memory access when a resource has changed (and also in checking if a resource has changed).

Numerous modifications, variations and adaptations of the examples, embodiments, and implementations described herein are encompassed by the attached claims.

The invention claimed is:

1. A computer-implemented method, the method comprising:
   modeling a plurality of resources in a simulator;
   wherein at least one resource being modeled in said simulator includes at least one of logic, storage and microcontroller;
   said simulator receiving, from a first application, a first indication of interest in monitoring an access to a first resource in said simulator;
   said simulator storing a first address of a first location in memory in response to receipt of said first indication;
   said simulator receiving, from a second application, a second indication of interest in monitoring said first resource;
   said simulator storing a second address of a second location in memory in response to receipt of said second indication;
   in response to said access to said first resource, said simulator updating each of said first location and said second location;
   wherein said first location is checked by the first application to determine if said first resource is accessed; and
   wherein said second location is checked by the second application to determine if said first resource is accessed.

2. The method of claim 1 wherein the first resource comprises a register modeled in said simulator, and the access to the first resource comprises a write operation which changes a value held in the register.

3. The method of claim 1 wherein the first resource being modeled comprises a memory that comprises a plurality of locations hereinafter referred to as "data memory locations" and the access to the first resource comprises a write operation which changes a value held in a data memory location.

4. The method of claim 3 wherein:
   the first location identified by said first address comprises a bitmap, and each bit in the bitmap corresponds to a data memory location;
   an active bit in the bitmap indicates that a value in the corresponding data memory location has changed; and
   an inactive bit in the bitmap indicates that a value in the corresponding data memory location remains unchanged.

5. The method of claim 1 wherein:
   said microcontroller is included in a second resource being modeled in said simulator;
   the access to the first resource is performed by the microcontroller in the second resource, in response to a statement of a computer program comprising an operator in a high level language; and
   said simulator performs said updating by invoking a predetermined method while simulating operation of the microcontroller, in response to the operator being overloaded.

6. The method of claim 1 wherein the first resource comprises a register and the access to the first resource comprises a read operation which maintains unchanged a value held in the register.

7. A computer-implemented method, the method comprising:
   modeling a plurality of resources in an emulator;
   a first resource in said plurality of resources receiving an access from at least another resource in said plurality of resources;

said emulator receiving, from a first application, a first indication of interest in monitoring said first resource in said emulator;

said emulator storing a first address of a first location in memory used by said first application to check if said first resource is accessed;

said emulator receiving, from a second application, a second indication of interest in monitoring said first resource;

said emulator storing a second address of a second location in memory used by said second application to check if said first resource is accessed;

in response to said access to said first resource, said emulator updating each of said first location and said second location.

8. The method of claim 7 wherein the plurality of resources are modeled in hardware by said emulator.

9. The method of claim 7 wherein the plurality of resources are modeled in software by said emulator.

10. A computer-implemented system, the system comprising:

a memory encoded with a plurality of applications, each application comprising:

means for generating an indication of interest in monitoring a resource; and means for checking a location known to said application to determine if said resource is accessed; and a simulator for modeling the resource, the simulator comprising:

means for storing an address of said location, in response to receipt of said indication of interest from said means for generating; and means for updating a plurality of locations known to said plurality of applications, in response to access of said resource.

11. The system of claim 10 wherein:

each application further comprises means for receiving a pointer to a set of memory locations including said location; and said simulator further comprises means for supplying said pointer if not previously identified.

* * * * *

UNITED STATES PATENT AND TRADEMARK OFFICE
CERTIFICATE OF CORRECTION

PATENT NO. : 7,162,401 B1 Page 1 of 1
APPLICATION NO. : 10/402817
DATED : January 9, 2007
INVENTOR(S) : Abeles It is certified that error appears in the above-identified patent and that said Letters Patent is hereby corrected as shown below:

Column 18
Line 4, "simulator;" should be changed to --simulator executing in a computer;--.

Signed and Sealed this

Twenty-eighth Day of August, 2007

JON W. DUDAS
*Director of the United States Patent and Trademark Office*